United States Patent
Yonehama et al.

(10) Patent No.: US 7,557,401 B2
(45) Date of Patent: Jul. 7, 2009

(54) SEMICONDUCTOR DEVICE AND METHOD OF MANUFACTURING THE SAME

(75) Inventors: Keisuke Yonehama, Mie (JP); Seiichi Mori, Tokyo (JP); Eiji Sakagami, Kanagawa (JP); Masahisa Sonoda, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 11/405,538

(22) Filed: Apr. 18, 2006

(65) Prior Publication Data

US 2006/0234448 A1 Oct. 19, 2006

(30) Foreign Application Priority Data

Apr. 18, 2005 (JP) ............................. 2005-119690

(51) Int. Cl.
H01L 29/76 (2006.01)
(52) U.S. Cl. .................... 257/314; 257/315; 438/257
(58) Field of Classification Search ......... 257/314–315, 257/295–296, 506, 508; 438/257
See application file for complete search history.

(56) References Cited

U.S. PATENT DOCUMENTS

2004/0079985 A1* 4/2004 Yonehama et al. .......... 257/315
2005/0023597 A1* 2/2005 Kutsukake et al. .......... 257/315

FOREIGN PATENT DOCUMENTS

JP 2002-158300 5/2002

* cited by examiner

*Primary Examiner*—Theresa T Doan
(74) *Attorney, Agent, or Firm*—Oblon, Spivak, McClelland, Maier & Neustadt, P.C.

(57) ABSTRACT

A semiconductor device includes an element isolation insulating film adjacent to an active area, a gate insulating film formed on a semiconductor substrate in the active area, paired gate electrodes located on the gate insulating film, a contact plug located on the active area between the gate electrodes, a pair of first upper lines located on the gate electrodes, a second upper line located on the gate electrodes, and a stopper film above upper surfaces of the gate electrodes and side surfaces of the gate electrodes. The element isolation insulating film has a first height of an upper surface thereof with reference to an upper surface of the semiconductor substrate and a second height of another upper surface thereof with reference to another upper surface of the semiconductor substrate. The first height is smaller than the second height.

14 Claims, 12 Drawing Sheets

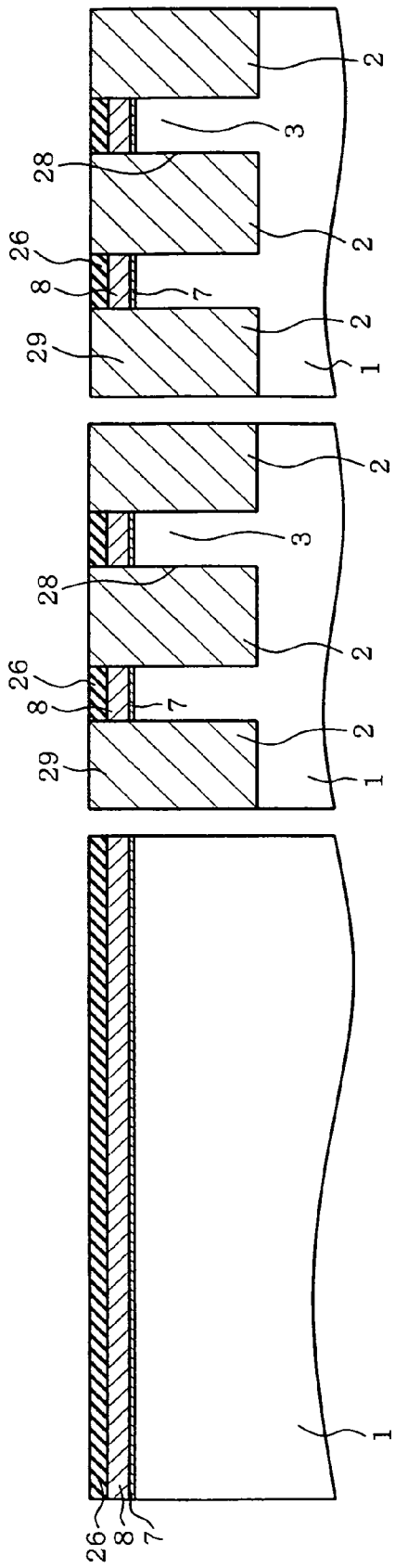

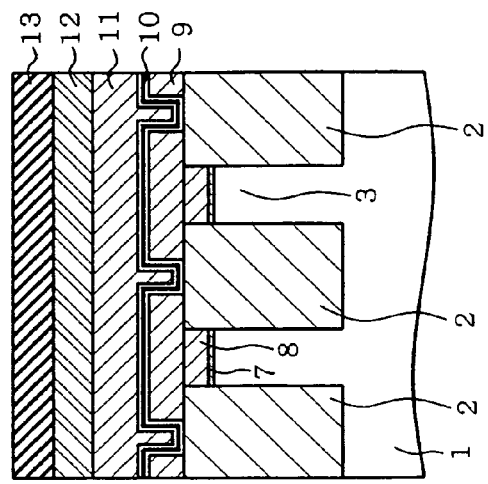
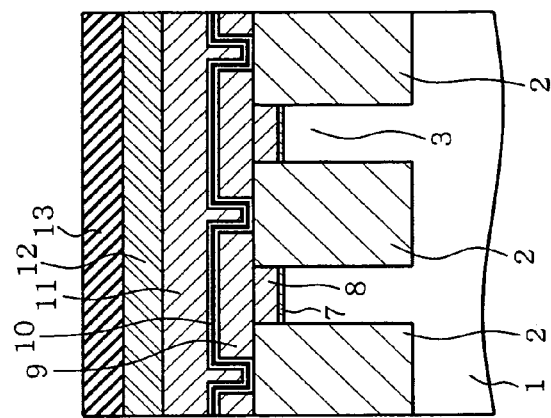
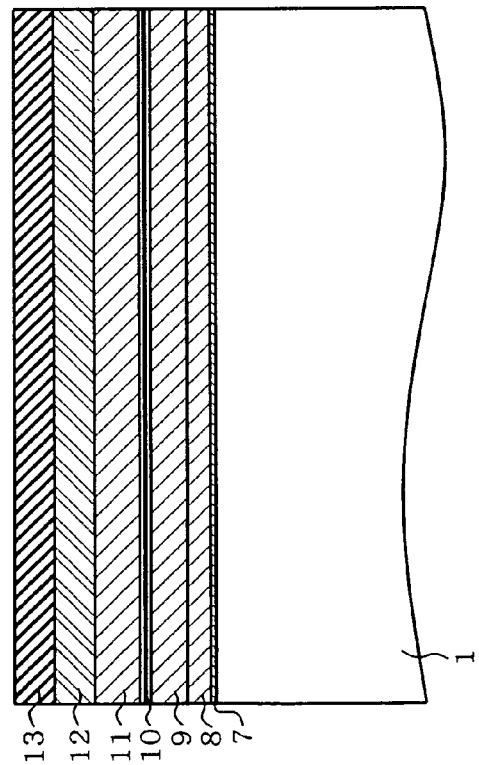

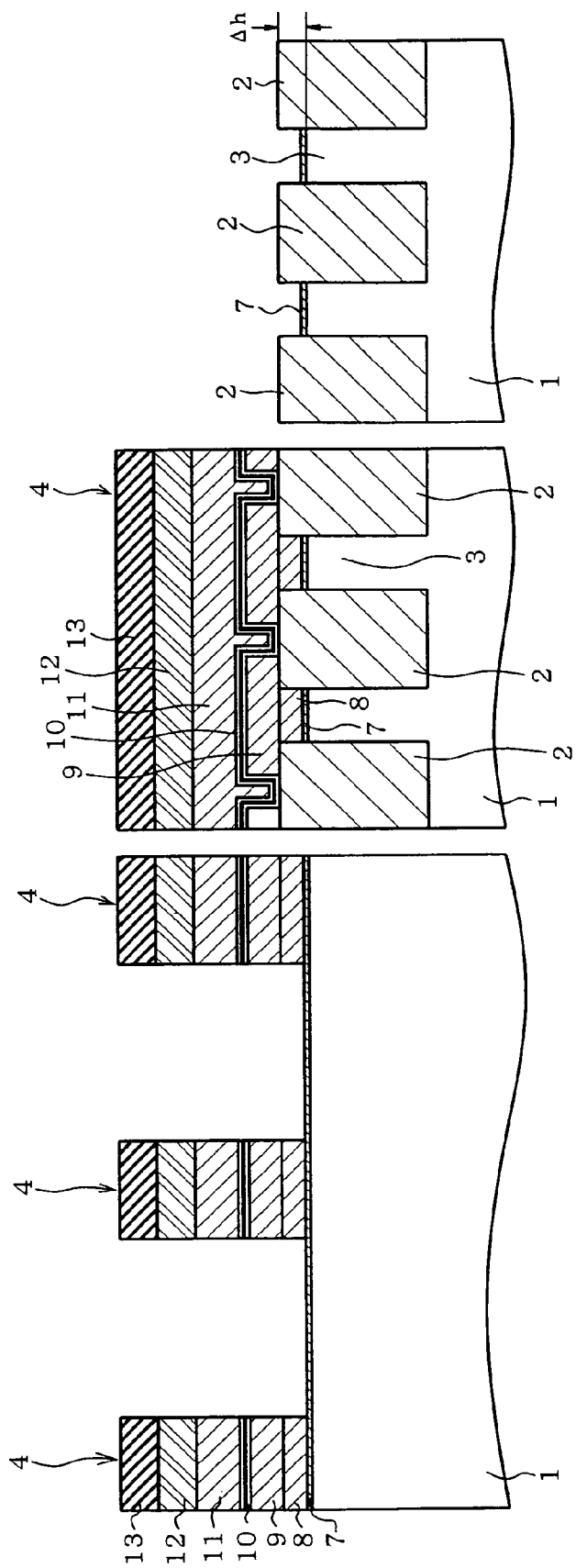

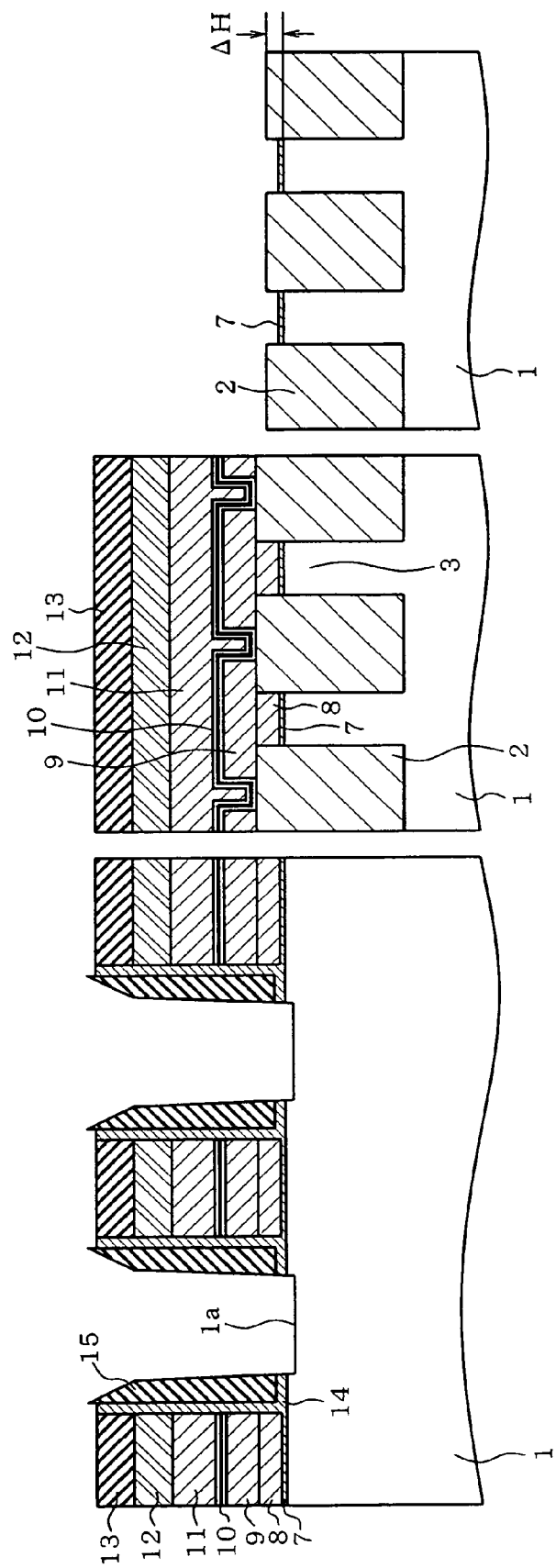

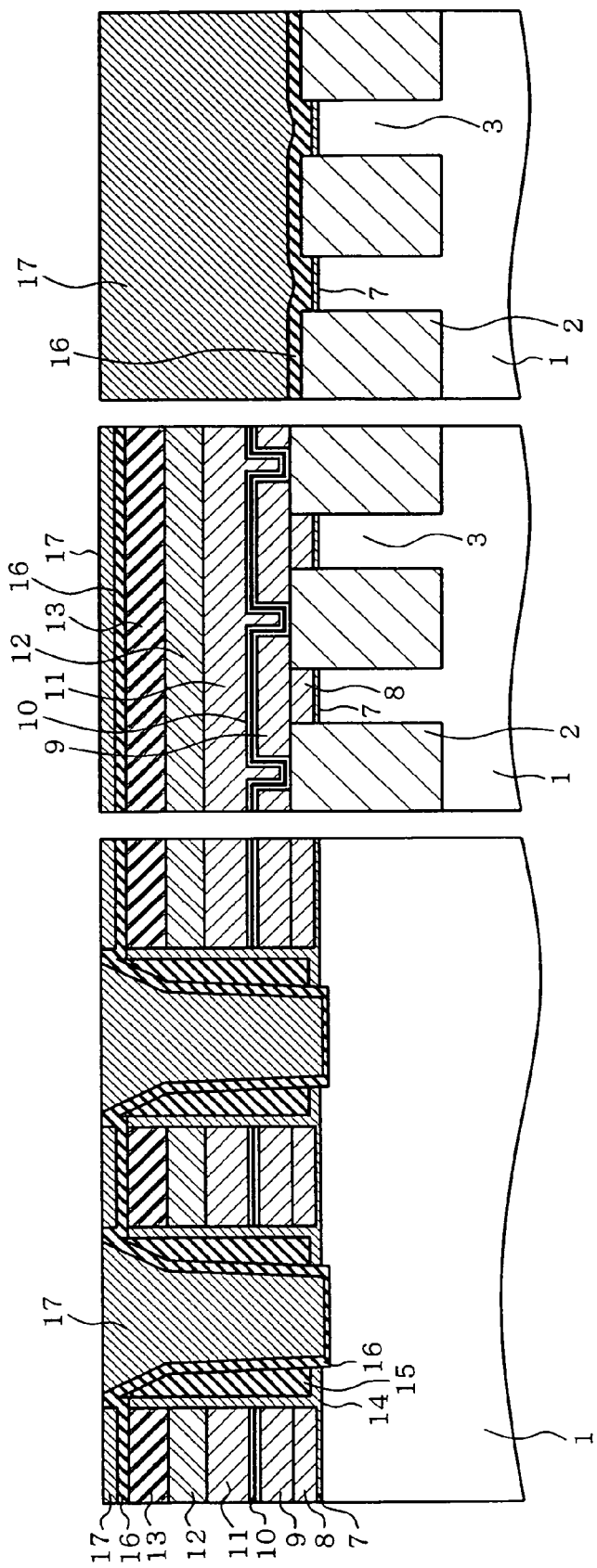

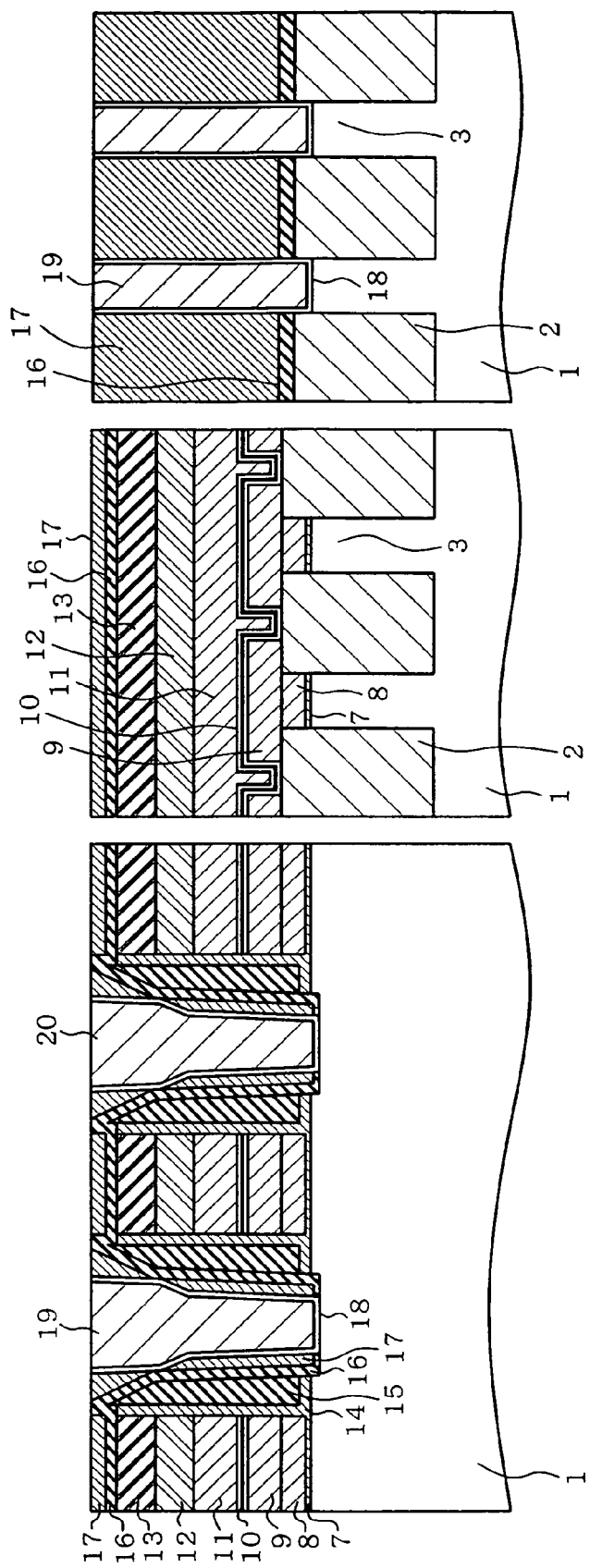

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2005-119690, filed on Apr. 18, 2005, the entire contents of which are incorporated herein by reference.

BACKGROUND OF THE INVENTION

1. Field of the Invention

The present invention relates to a semiconductor device having a structure that memory cell transistors are isolated by an element isolation insulating film thereby to be formed and a method of manufacturing the same.

2. Description of the Related Art

For example, a NOR flash memory is one of memories employing a shallow trench isolation (STI) structure which is one of structures that memory cell transistors are isolated by an element isolation insulating film thereby to be formed. The NOR flash memory employs an arrangement that a contact hole is formed in a drain of each of a number of memory cell transistors so that an electrode is connected to the contact hole. Furthermore, since each memory cell transistor generally employs a lightly doped drain (LDD) structure, a silicon nitride film serving as a spacer is formed on an end face of a gate electrode.

For example, JP-A-2002-158300 discloses the aforementioned arrangement. FIG. 5 of this document shows a silicon nitride film formed as a spacer on a sidewall of a gate electrode and a contact hole which is formed so as to make a contact. This document discloses the following manufacturing process of a semiconductor device. Firstly, on a silicon substrate are deposited a gate insulating film, a first polycrystalline silicon film serving as a floating gate electrode, a first silicon nitride film and a silicon oxide film in this sequence. A photolithography process is carried out to form a resist pattern for formation of an element isolation region. A resist pattern for formation of an element isolation region is then formed by a photolithography process. The silicon oxide film and the first nitride film are etched by a reactive ion etching (RIE) process with the resist pattern serving as a mask. Thereafter, the resist pattern is removed. Subsequently, the first polycrystalline silicon film is etched with the silicon oxide film serving as a mask. Furthermore, the gate insulating film and the silicon substrate are etched so that a trench is formed in the silicon substrate.

Subsequently, a silicon oxide film is formed on an inner wall of the trench. Furthermore, another silicon oxide film is buried in the trench by a high density plasma (HDP) process. A planarizing process is carried out for the buried silicon oxide film by a chemical mechanical polishing (CMP) process with the first silicon nitride film serving as a stopper. The first silicon nitride film is then removed by phosphating. A second polycrystalline silicon film doped with phosphor is deposited by a low pressure chemical vapor deposition (LP-CVD) process. The second polycrystalline silicon film is etched by the RIE process with photoresist serving as a mask.

An oxide-nitride-oxide (ONO) film and a third polycrystalline silicon film doped with phosphor and serving as a control gate are deposited by the LP-CVD process in turn. Successively, a tungsten silicide (WSi) film and a silicon oxide film are deposited by the LP-CVD process in turn. Subsequently, a resist pattern is formed by the photolithography process. The RIE process is then carried out to process the silicon oxide film, the WSi film, the third polycrystalline silicon film, the ONO film, the second polycrystalline silicon film and the first polycrystalline silicon film, whereby a gate electrode is formed.

Subsequently, impurities are introduced into a source/drain region by an ion implantation process, and a second silicon nitride film is deposited by the LP-CVD process. A spacer is then formed by the RIE process. A third silicon nitride film is deposited so as to be superposed on the spacer. An insulating film is deposited by a normal pressure CVD process, and a planarizing process is carried out until the third silicon nitride film is exposed by the CMP process. An interlayer insulating film is formed so as to be buried in a gap between the gate electrodes. Subsequently, the wafer process is completed through the forming of contact holes and the forming of electrode patterns.

In the above-described arrangement, the spacer of silicon nitride film is formed on the sidewall of the gate electrode in order that each memory cell transistor may have the LDD structure. When an employed manufacturing process includes a step of forming an STI structure for isolation of elements after previous formation of a part of the gate structure, the following drawback is found: in the above-described manufacturing process, immediately after formation of the gate electrode, there is a difference in level between the upper surface of the silicon substrate or an active area (an element isolation region) and an upper surface of the STI which is an element isolation region, in a part where a layer serving as a gate electrode has been removed by the etching process. Since a width of the active area is rendered smaller as the design rules are refined more, an amount of part of the sidewall remaining unetched from an upper part to a lower part is increased according to an extent of the difference in the RIE process executed after the third silicon nitride film has been buried. This results in limitations in a contact area in the case where the drain contact of the active area is formed, thereby increasing a drain contact resistance.

BRIEF SUMMARY OF THE INVENTION

Therefore, an object of the present invention is to provide a semiconductor device which can reduce the difference in level between the insulating film in the element isolation region of the drain contact formation region and the element formation region thereby to reduce a contact resistance and prevent the gate insulating film from being adversely affected, and a method of manufacturing the same.

In one aspect, the invention provides a semiconductor device comprising a semiconductor substrate including an active area extending in a first direction, an element isolation insulating film which is adjacent to the active area and extends in the first direction, a gate insulating film formed on the semiconductor substrate in the active area, a pair of gate electrodes located on the gate insulating film, a contact plug located on the active area between the gate electrodes, a pair of first upper lines located on the gate electrodes and extending in a second direction perpendicular to the first direction and corresponding to the gate electrodes respectively, a second upper line located on the gate electrodes and extending in the first direction, and a stopper film located above first upper surfaces of the gate electrodes and side surfaces of the gate electrodes. The semiconductor substrate has a second upper surface located below the gate electrodes, the element isolation insulating film has a third upper surface adjacent to the contact plug in the second direction and fourth upper surface adjacent to the gate electrodes in the second direction, the element isolation insulating film has a first height of the third upper surface thereof with reference to the second upper surface of the semiconductor substrate and a second height of the fourth upper surface thereof with reference to the second upper surface of the semiconductor substrate, and the first height of the third upper surface is smaller than the second height of the fourth upper surface.

In another aspect, the invention provides a method of manufacturing a semiconductor device, comprising the steps of forming gate electrodes in an element formation region defined by an element isolation insulating film formed on a semiconductor substrate, each gate electrode having both sides, covering the sides of each gate electrode with a spacer insulating film, etching the element isolation insulating film exposed between the gate electrodes so that a difference in level between the element isolation insulating film and a surface of the semiconductor substrate is reduced, forming a stopper film for forming a contact, forming an interlayer insulating film so as to be buried in a gap between the gate electrodes, and flattening the interlayer insulating film, thereby forming a contact hole.

BRIEF DESCRIPTION OF THE DRAWINGS

Other objects, features and advantages of the present invention will become clear upon reviewing the following description of the embodiment with reference to the accompanying drawings, in which:

FIGS. 4A through 12C are sectional views of the semiconductor device in sequential steps of the manufacturing process.

DETAILED DESCRIPTION OF THE INVENTION

One embodiment of the present invention will be described with reference to the accompanying drawings. The invention is applied to a NOR flash memory in the embodiment.

Figure 1:
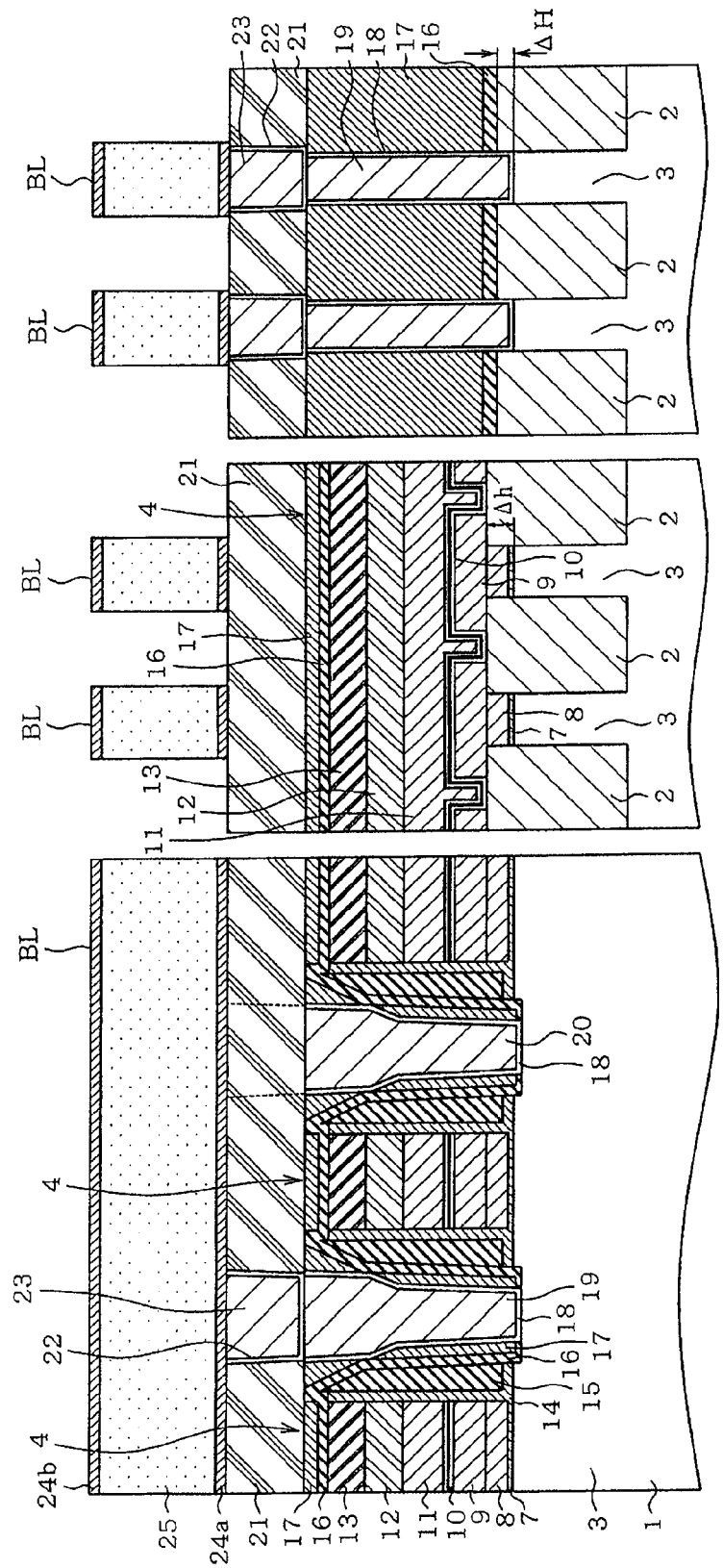
FIGS. 1A, 1B and 1C are schematic sectional views of a semiconductor device in accordance with one embodiment of the present invention.
Figure 2:
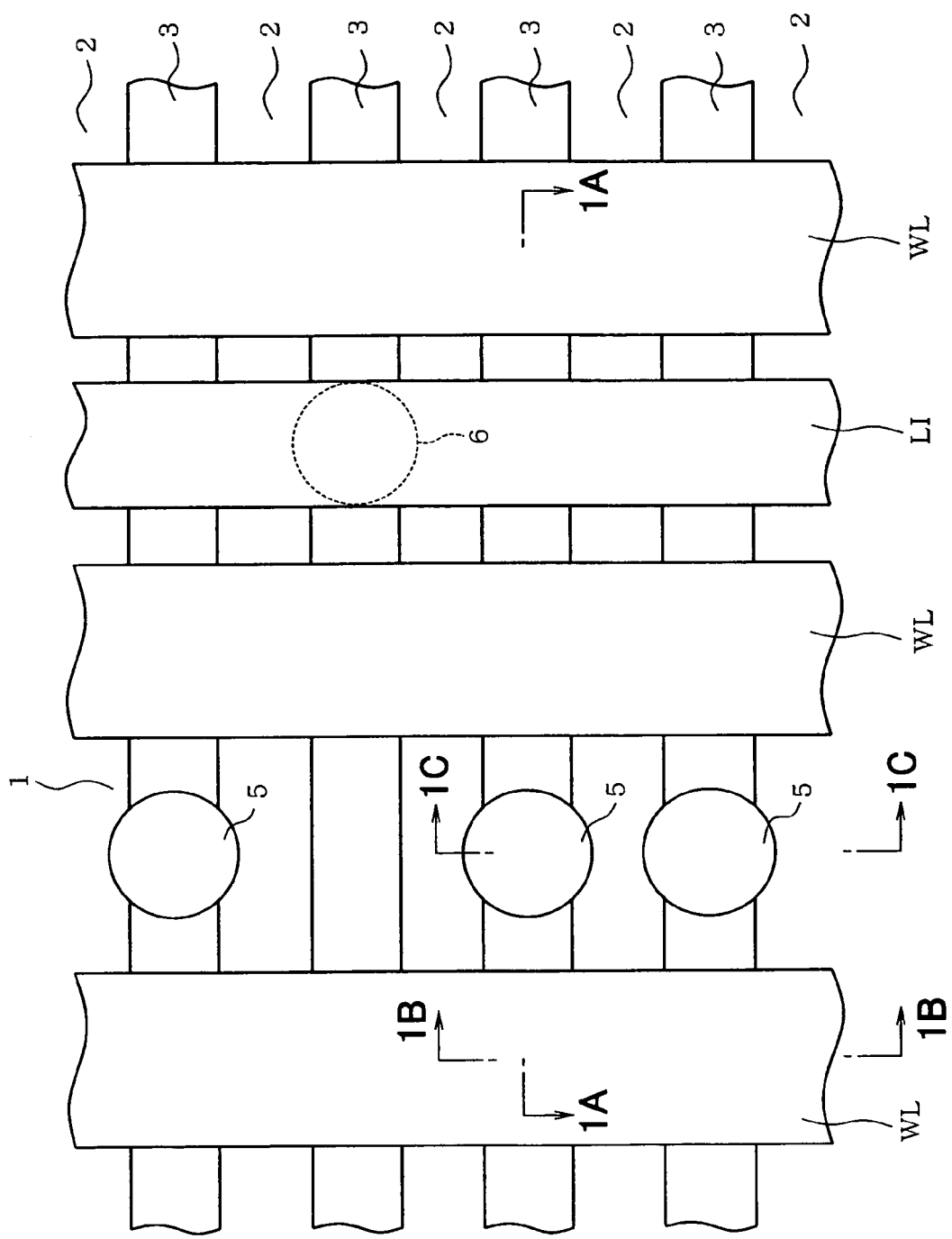
FIG. 2 is a plan view of the semiconductor device.

FIGS. 1A to 1C schematically show memory cell transistors in a memory cell region of the NOR flash memory. FIG. 2 shows positions where the views of FIGS. 1A to 1C are taken. Referring to FIG. 2, a silicon substrate 1 serving as a semiconductor substrate is formed with a shallow trench isolation (STI) 2 serving as an element isolation insulating film, whereby active areas 3 are defined as element formation regions.

Word lines WL are formed at predetermined intervals so as to intersect the active areas 3. Of gate electrodes 4 formed in the respective memory cell transistors, each word line WL corresponds to a control gate electrode to be formed between adjacent memory cell transistors with the STI 2 being interposed therebetween. Each active area 3 exposed between adjacent word lines WL includes a drain area and a source area formed alternately. Drain contacts 5 are formed so as to connect the drain areas and a bit line BL. Each drain contact 5 has a diameter set to be larger than a width of the active area 3. A source line L1 is formed in parallel to the word lines WL so that the adjacent source areas are electrically connected together. The source line L1 includes a source contact 6 connecting the source line L1 to a wiring layer.

FIGS. 1A, 1B and 1C are schematic longitudinal sections taken along lines 1A-1A, 1B-1B and 1C-1C in FIG. 2 respectively. More specifically, FIG. 1A is a sectional view taken in the direction of arrangement of the active areas 3. FIG. 1B is a sectional view taken in the direction of arrangement of the word lines WL. FIG. 1C is a sectional view taken in the direction of alignment of the drain contacts 5.

Referring first to FIG. 1A, the section of the active area 3 is shown. A first silicon oxide film 7 serving as a gate insulating film is formed on the surface of the silicon substrate 1. Gate electrodes 4 are formed on the first silicon oxide film 7 at predetermined intervals. Each gate electrode 4 is formed by depositing a first polycrystalline silicon film 8, a second polycrystalline silicon film 9, an ONO film 10, a third polycrystalline silicon film 11, a WSi film 12 and a second silicon oxide film 13 sequentially from a lower layer. A third oxide film 14 is formed on the side of each gate electrode 4 and a part of the surface of the silicon substrate 1 corresponding to a section between the gate electrodes 4. A first silicon nitride film 15 serving as a spacer is deposited on the side of the third silicon film 14. Furthermore, a second silicon nitride film 16 is formed so as to cover an upper surface of the gate electrode 4 and a side of the silicon nitride film 15. The second silicon nitride film 16 serves as a stopper film for forming a contact. A fourth silicon oxide film 17 is formed on the upper surface of the gate electrode 4 and further on the second silicon nitride film 16.

The drain and source contacts are formed so to as to be located right and left respectively between the adjacent gate electrodes 4. Each part of the silicon substrate 1 on which a contact is formed is slightly depressed as shown in FIG. 1A. In order that a difference in level of the STI 2 may be reduced in the manufacturing process described later, the silicon substrate 1 is also depressed in a step of etching the STI 2. This is the reason for the above-described depression.

Lower ends of the second silicon nitride film 16 and the insulating film 17 are adapted to be located on the depression. This results from an etching process for the silicon substrate 1 immediately before a step of forming the second silicon nitride film 16. A drain diffusion region and a source diffusion region are formed on the etched surface of the silicon substrate 1. A titanium film 18 serves as a barrier metal. A tungsten plug 19 serves as the drain contact 5. A tungsten film 20 serves as a source line L1. All these films and plugs 18 to 20 are formed so as to electrically contact each diffusion region.

Upper surfaces of the aforesaid films and plugs 18 to 20 are flattened, and a fifth silicon oxide film 21 is formed the flattened surfaces. Via holes are formed in the fifth silicon oxide film 21 so as to assume positions corresponding to the drain contacts 5 and the source contacts 6. A titanium film 22 serving as a barrier metal and a tungsten plug 23 are buried in the via holes. The bit line BL is formed over the titanium films 22 and tungsten plugs 23. The bit line BL includes two titanium films 24a and 24b and a metal layer 25 interposed between the titanium films 24a and 24b.

Referring next to FIG. 1B, the silicon substrate 1 is provided with the STI 2 including the trench in which an insulating film is buried. The STI 2 divides the silicon substrate 1 into a plurality of active areas 3. The STI 2 is formed so as to correspond with the level of an upper surface of the first polycrystalline silicon film 8 formed in each active area 3.

The polycrystalline silicon film 9 is divided by the STI 2 and forms a floating gate together with the lower first polycrystalline silicon film 8. As a result, since the floating gate has a generally T-shaped section with an upper part protruding horizontally, a coupling ratio can be increased.

The ONO film 10 is formed along an upper surface of the second polycrystalline silicon film 9 constituting the floating gate electrode and functions as a gate insulating film opposed to the control gate electrode. The control gate electrode is composed of the deposited third polycrystalline silicon film 11, WSi film 12 and second silicon oxide film 13. The second silicon nitride film 16 and the fourth silicon film 17 are formed on the second silicon oxide film 13. Furthermore, a fifth silicon oxide film 21 serving as an interlayer insulating film is formed on the fourth silicon film 17.

Referring now to FIG. 1C, the STI 2 is formed so that a level difference ΔH between the silicon substrate 1 and the STI 2 is smaller than a level difference Δh as shown in FIG. 1B. The reason for this is that the STI 2 is etched as will be described later in the manufacturing process. The second silicon nitride film 16 and the fourth silicon oxide film 17 are deposited on the STI 2 in turn. The titanium film 18 composing the drain contact 5 and the tungsten plug 19 are formed on the active area 3. The upper surfaces of the titanium film 18 and the tungsten plug 19 are planarized. The fifth silicon oxide film 21 is formed on the upper surfaces of the titanium film 18 and the tungsten plug 19. The titanium film 22 and the tungsten plug 23 are so as to correspond to the drain contacts 5 and are electrically connected to the upper bit line BL.

Figure 3:
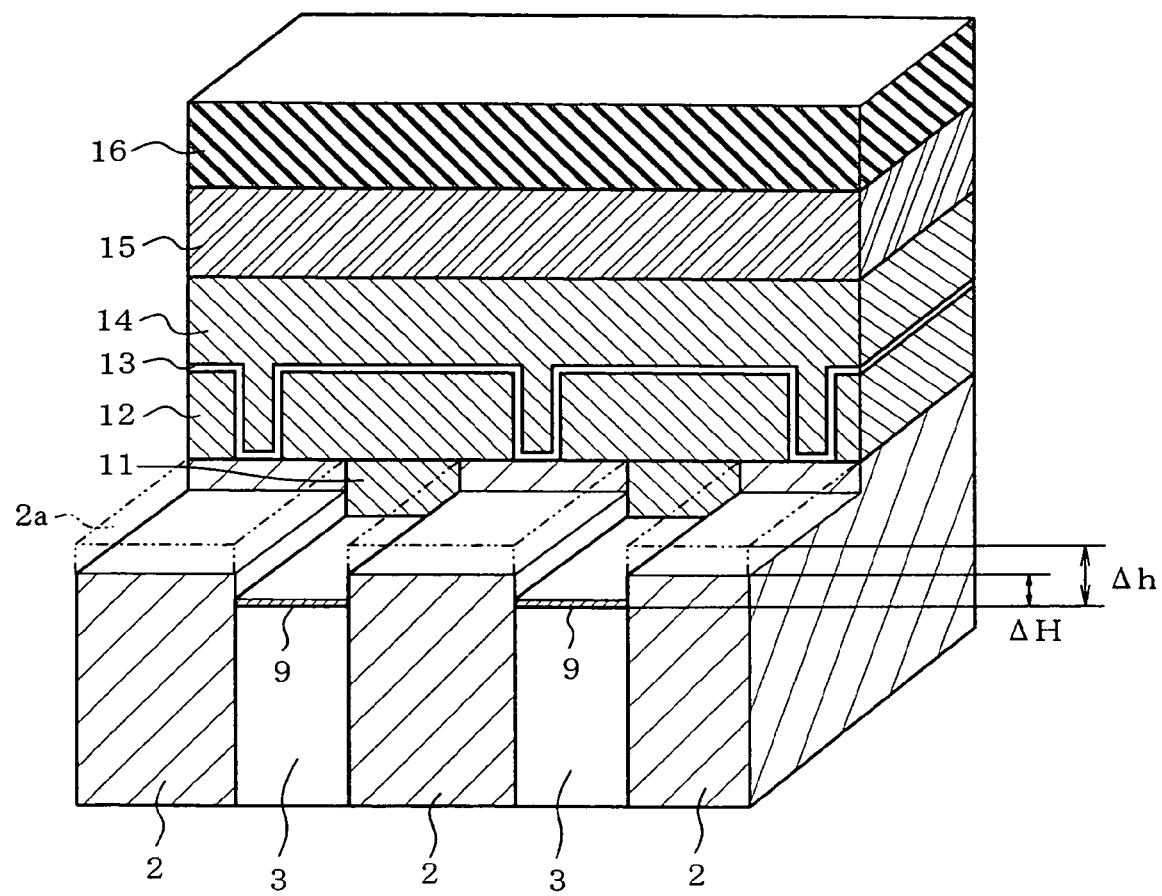
FIG. 3 is a schematic perspective view of the semiconductor device after formation of gate electrodes.

Referring to FIG. 3, the structure of FIGS. 1B and 1C is three-dimensionally shown. An upper structure of the STI 2 is eliminated in order that the level difference ΔH between the STI 2 as shown in FIG. 1C and the active area 3 may become clear. As understood from FIG. 3, a part designated by the reference symbol "2a" is to be eliminated by the etching process.

In the foregoing structure, the STI 2 is formed so that the level difference ΔH is smaller than dimension Δh of the corresponding part in FIG. 1B, as shown in FIG. 3 or 1C. Consequently, when the silicon nitride film 16 is formed and etched in forming the drain contact 5, occurrence of a spacer-like post-etching residue due to the degree of level difference can be suppressed. Furthermore, since a contact area of the active area 3 is prevented from being reduced, a desired ohmic contact can be formed.

The manufacturing process of the foregoing structure will be described with reference to FIGS. 4 to 12. Suffixes A, B and C in FIGS. 4A to 12C correspond to the sectional views of FIGS. 1A, 1B and 1C respectively.

Figures 4A, 4B, 4C:
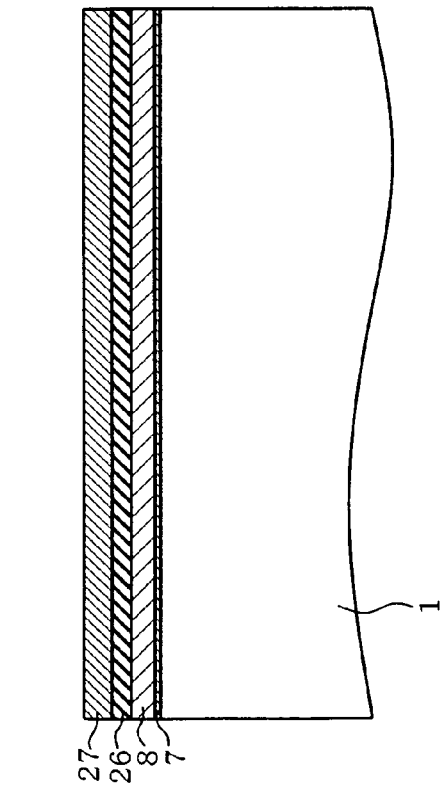

Referring to FIGS. 4A to 4C, the first silicon oxide film 7 and the first polycrystalline silicon film 8 are formed in the main surface of the silicon substrate 1. Furthermore, the third silicon nitride film 26 and the sixth silicon oxide film 27 are also formed. The first silicon oxide film 7 in the shown memory cell region is formed so as to have a small film thickness of about 8 nm. Regarding high-breakdown voltage transistors in a peripheral circuit region (not shown), the first silicon oxide film 7 having a film thickness of about 40 nm is formed through another process.

Figure 5C:
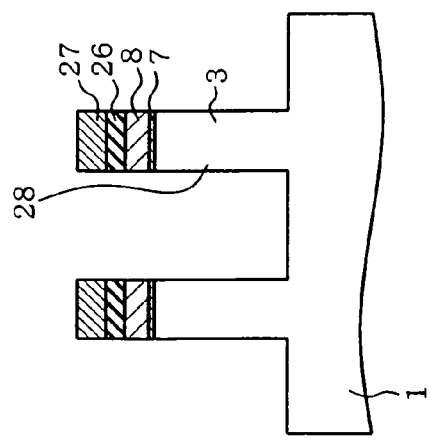
Figure 5B:
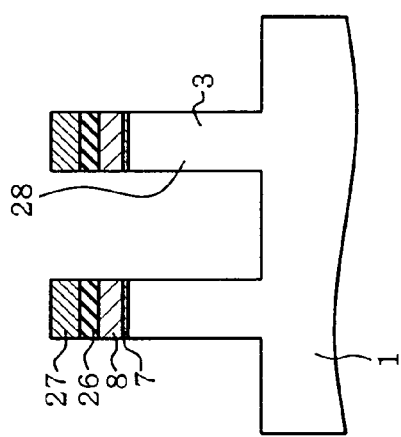
Figure 5A:
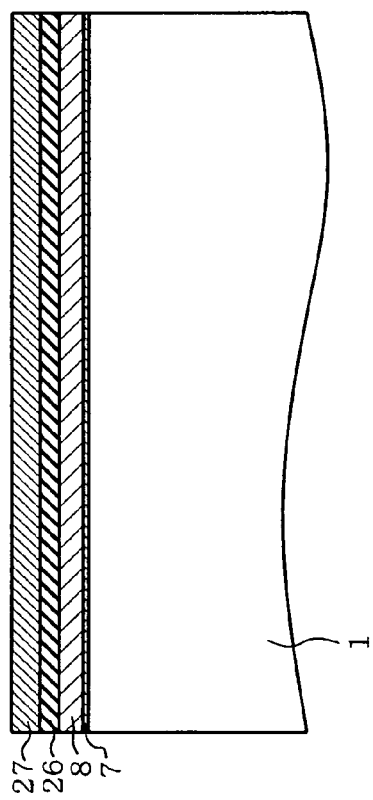

Referring to FIGS. 5A to 5C, a trench 28 is formed in a portion where the STI 2 is to be formed. Firstly, photoresist is patterned to the pattern of the STI 2 by the photolithography process. The sixth silicon oxide film 27 and the third silicon nitride film 26 are etched by the RIE process with the aforesaid pattern serving as a mask. Successively, the first polycrystalline silicon film 8, the first silicon oxide film 7 and the silicon substrate 1 are etch also by the RIE process while the processed sixth silicon oxide film 27 and third silicon nitride film 26 serve as masks, whereby the trench 28 with a predetermined depth is formed.

Figures 6A, 6B, 6C:
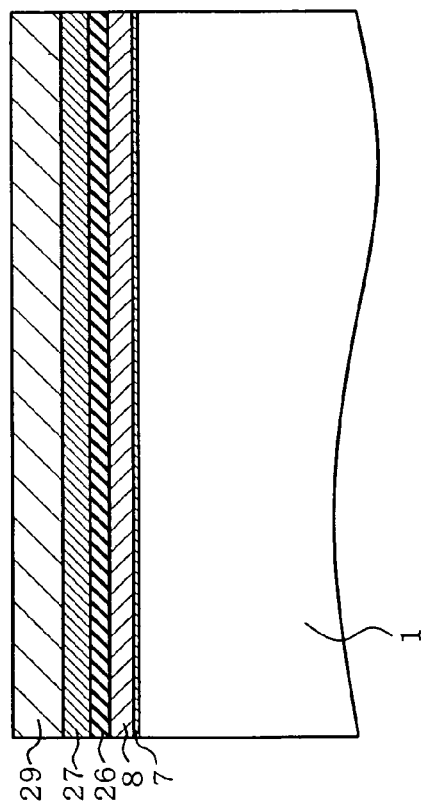

Subsequently, a silicon oxide film (not shown) is formed on the surface of the etched trench 28, and then, as shown in FIGS. 6A to 6C, a seventh silicon oxide film 29 is formed so as to be buried in the trench 28. For example, a high density plasma (HDP) process is carried out for the formation of the seventh silicon oxide film 29.

Subsequently, the seventh silicon oxide film 29 is polished by a chemical mechanical polish (CMP) process, whereby a planarizing process is carried out, as shown in FIGS. 7A to 7C. In the CMP process, the third silicon nitride film 26 is employed as a stopper. The polish is continued until the sixth silicon oxide film 26 is completely delaminated.

Subsequently, the manufacturing process advances to a stage before formation of the gate electrode 4 as shown in FIGS. 8A to 8C. In the above-described state as shown in FIGS. 7A-7C, the third silicon nitride film 26 is removed by the phosphating. Next, the second polycrystalline silicon film 9 doped with phosphor is deposited by the LP-CVD process. The second polycrystalline silicon film 9 is processed by the photolithography with photoresist serving as a mask so that the STI 2 is divided at a central part thereof using the RIE process. The floating gate electrode is composed of the first and second polycrystalline silicon films 8 and 9 and has a T-shaped section. Next, the ONO film 10, the third polycrystalline 11 doped with phosphor, the WSi film 12 and the second silicon oxide film 13 are deposited sequentially by the LP-CVD process.

Subsequently, the gate electrode 4 is formed as shown in FIGS. 9A to 9C. Firstly, photoresist (not shown) is patterned into a desired pattern by the photolithography process. The second silicon oxide film 13 is processed by the RIE process with the photoresist serving as a mask. The WSi film 12, the third polycrystalline 11, the ONO film 10, the second polycrystalline silicon film 9 and the first polycrystalline silicon film 8 are processed by the RIE process with the second silicon oxide film 13 serving as a mask, so that the gate electrode 4 is formed.

Subsequently, the spacer 15 is formed on the sidewall of the gate electrode 4 as shown in FIGS. 10A to 10C. Firstly, the third silicon oxide film 14 is formed on the sidewall of the gate electrode 4. Next, impurities are implanted into the source/drain region by the ion implantation method so that an impurity area (not shown) is formed. Next, the first silicon nitride film is deposited by the LP-CVD process and thereafter etched back by the RIE process so that the first silicon nitride film 15 serving as a spacer is formed on the sidewall of the gate electrode 4. Next, the upper surface of the STI 2 exposed between the adjacent gate electrodes 4 is etched back such that the level difference Δh between the silicon substrate 1 and the STI 2 is reduced to ΔH. In this case, the RIE process is employed to etch the STI 2, and the exposed silicon substrate 1 is slightly etched simultaneously. Also, in this case, the remaining third silicon oxide film 14 is further etched after the first silicon nitride film 15 on the gate electrode 4 has been etched thereby to be removed. As a result, an upper end of the first silicon nitride film 15 remaining as the spacer slightly protrudes upward from the end face of the gate electrode 4.

Furthermore, the process of etching the surface of the silicon substrate 1 is carried out after the second silicon nitride film 15 as the spacer has been formed on the gate electrode 4. Consequently, since the end face of the gate electrode 4 is not directly exposed, the end face of the first silicon oxide film 7 serving as the gate insulating film is protected, whereupon the end face can be prevented from being damaged in subsequent steps.

Subsequently, as shown in FIGS. 11A to 11C, the second silicon nitride film 16 serving as a stopper is formed, and the fourth silicon oxide film 17 serving as an insulating film is formed on the second silicon nitride film 16 by an atmospheric pressure CVD (APCVD) so as to have a sufficient film thickness to fill a gap between the adjacent gate electrodes 4. Thereafter, the fourth silicon oxide film 17 is etched until an upper surface of the second silicon nitride film 16 serving as a stopper is exposed, thereby being flattened.

Subsequently, contact holes are formed and the contact plugs 19 and 20 are buried in the contact holes respectively, as shown in FIGS. 12A to 12C. The silicon oxide film is deposited by the plasma CVD process in the state as shown in FIGS. 11A to 11C. Subsequently, photoresist is formed by the photolithography process into a pattern corresponding to the drain contact 5 and a current condition of the source line 6. The silicon oxide film and the fourth silicon oxide film 14 are processed by the RIE process with the photoresist pattern serving as a mask, so that the contact holes for the source line 6 and the drain contacts 5 are simultaneously formed.

In the above-described formation of the contact holes, the contact hole for each drain contact 5 is set so as to have a larger diameter than a width of the active area 3 in the upper opening. As shown in FIG. 12A, the active area 3 between the gate electrodes 4 is positioned by the first silicon nitride film 15 serving as the spacer and the like in a self-aligning manner.

Subsequently, the photoresist is removed, and the second silicon nitride film 16 is processed by the RIE process until the silicon substrate 1 is exposed. Successively, the titanium film (TiN film) and the tungsten film are deposited by the PVD process. The tungsten film and the titanium film (TiN film) by the CMP process until the silicon oxide film 17 is exposed.

Subsequently, as shown in FIG. 1A to 1C, the fifth silicon oxide film 21 is deposited, and photoresist is formed by the photolithography process into a predetermined pattern. The fifth silicon oxide film 21 is processed by the RIE process so that the titanium film 22 and tungsten film 23 conducting a metal wiring layer of the bit line and CS/LI. Subsequently, the metal wiring layer 25 of the bit line is formed, and the wafer process is finished.

According to the foregoing embodiment, the process is carried out so that the level difference between the element formation region 3 of the silicon substrate 1 and the STI 2 is reduced when the second silicon nitride film 16 is deposited. Accordingly, occurrence of a spacer-like post-etching residue due to the degree of level difference can be suppressed in the forming of the drain contact 5. Consequently, reduction in the contact area can be suppressed and the contact resistance can be reduced.

Furthermore, the above process is carried out after the first silicon nitride film 15 has been formed into the spacer on the sidewall of the gate electrode 4. Consequently, the gate electrode 4 can be prevented from being damaged by the process of etching the STI 2, whereupon the first silicon oxide film 7 serving as the gate insulating film can be prevented from being adversely affected and accordingly, deterioration of characteristics can be suppressed.

The invention should not be limited to the foregoing embodiment. The embodiment may be modified or expanded as follows. The silicon nitride film is used as the spacer formed on the gate electrode in the foregoing embodiment. However, another insulating film may be used, instead. Furthermore, the invention is applied to the NOR flash memory in the foregoing embodiment. However, the invention may be applied to a semiconductor device including a transistor provided with a gate insulating film in an active area isolated by the STI.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A semiconductor device comprising:
   a semiconductor substrate including an active area extending in a first direction;
   an element isolation insulating film which is adjacent to the active area and extends in the first direction;
   a gate insulating film formed on the semiconductor substrate in the active area;
   a pair of gate electrodes located on the gate insulating film;
   a contact plug located on the active area between the gate electrodes;
   a pair of first upper lines located on the gate electrodes and extending in a second direction perpendicular to the first direction and corresponding to the gate electrodes respectively;
   a second upper line located on the gate electrodes and extending in the first direction; and
   a stopper film located above first upper surfaces of the gate electrodes and side surfaces of the gate electrodes,
   wherein the semiconductor substrate has a second upper surface located below the gate electrodes;
   the element isolation insulating film has a third upper surface adjacent to the contact plug in the second direction and fourth upper surface adjacent to the gate electrodes in the second direction;
   the element isolation insulating film has a first height of the third upper surface thereof with reference to the second upper surface of the semiconductor substrate and a second height of the fourth upper surface thereof with reference to the second upper surface of the semiconductor substrate; and
   the first height of the third upper surface is smaller than the second height of the fourth upper surface.

2. The semiconductor device according to claim 1, wherein the semiconductor substrate has a fifth upper surface located below the contact plug, the fifth upper surface being lower than the second upper surface of the semiconductor substrate.

3. The semiconductor device according to claim 1, wherein the contact has a diameter larger than a width of the active area in the second direction.

4. The semiconductor device according to claim 1, wherein the gate electrode includes a floating gate electrode located on the gate insulating film, an ONO film located on the floating gate electrode and a control gate electrode located on the ONO film.

5. The semiconductor device according to claim 4, wherein the control gate electrode includes a polycrystalline silicon film located on the ONO film and a suicide film formed on the polycrystalline silicon film.

6. The semiconductor device according to claim 5, wherein the silicide film includes a tungsten silicide film.

7. The semiconductor device according to claim 4, wherein the floating gate electrode includes a polycrystalline silicon film.

8. The semiconductor device according to claim 4, wherein the control gate electrode includes a silicon oxide film between the control gate electrode and the stopper film.

9. The semiconductor device according to claim 1, wherein each first upper line includes a word line.

10. The semiconductor device according to claim 1, wherein the second upper line includes a bit line.

11. The semiconductor device according to claim 1, wherein the stopper film includes a silicon nitride film.

12. The semiconductor device according to claim 1, wherein the element isolation insulating film includes a silicon oxide film.

13. The semiconductor device according to claim 1, wherein the stopper film is located on a silicon oxide film formed on the side surface of the gate electrode.

14. The semiconductor device according to claim 1, wherein the contact plug includes a tungsten film.

* * * * *